US005814883A

United States Patent [19]

Sawai et al.

[11] Patent Number: 5,814,883

[45] **Date of Patent: *Sep. 29, 1998**

[54] PACKAGED SEMICONDUCTOR CHIP

[75] Inventors: Akiyoshi Sawai; Kisamitsu Ono; Hideyuki Ichiyama, all of Tokyo; Katsunori Asai, Itami, all of Japan

[73] Assignees: Mitsubishi Denki Kabushiki Kaisha, Tokyo; Ryoden Semiconductor System Eengineering Corporation, Hyogo, both of Japan

[ * ] Notice: This patent issued on a continued prosecution application filed under 37 CFR 1.53(d), and is subject to the twenty year patent term provisions of 35 U.S.C. 154(a)(2).

[21] Appl. No.: 640,504

[22] Filed: May 1, 1996

[30] Foreign Application Priority Data

Oct. 4, 1995 [JP] Japan .................................... 7-257671

[51] Int. Cl.[6] .......................... H01L 23/12; H01L 23/48; H01L 23/38; H01L 23/36

[52] U.S. Cl. .......................... 257/712; 257/700; 257/706; 257/707; 257/675; 257/717; 257/720; 257/704; 257/738

[58] Field of Search .................................... 257/706, 707, 257/710, 712, 717, 720, 675, 704, 700, 734, 737, 738

[56] References Cited

U.S. PATENT DOCUMENTS

| | | | |
|---|---|---|---|
| 4,922,324 | 5/1990 | Sudo | 257/700 |
| 5,008,734 | 4/1991 | Dutta et al. | 257/707 |
| 5,343,076 | 8/1994 | Katayama et al. | 257/704 |
| 5,422,615 | 6/1995 | Shibagaki et al. | 257/704 |
| 5,455,456 | 10/1995 | Newman | 257/704 |
| 5,463,250 | 10/1995 | Nguyen et al. | 257/707 |
| 5,491,362 | 2/1996 | Hamzehdoost et al. | 257/680 |
| 5,521,332 | 5/1996 | Shikata et al. | 257/700 |
| 5,541,450 | 7/1996 | Jones et al. | 257/780 |

FOREIGN PATENT DOCUMENTS

| | | | |
|---|---|---|---|
| 1-53568 | 3/1989 | Japan | 257/717 |
| 4-107958 | 4/1992 | Japan | 257/712 |
| 4-245459 | 9/1992 | Japan | 257/706 |
| 4-303955 | 10/1992 | Japan | 257/712 |
| 94025984 A1 | 11/1994 | WIPO | 257/697 |

*Primary Examiner*—Tom Thomas
*Assistant Examiner*—Alexander Oscar Williams
*Attorney, Agent, or Firm*—Leydig, Voit & Mayer, Ltd.

[57] ABSTRACT

A semiconductor device includes a substrate having a recess; a semiconductor chip disposed in the recess; a plurality of external electrodes disposed on the substrate; a lid covering the recess; and a heat radiator disposed between the semiconductor chip and the substrate for transmitting heat generated by the semiconductor chip to the substrate for radiation.

7 Claims, 9 Drawing Sheets

| | Structure | Evaluation item | Moisture absorption time (30°C/70%) | | | | |
|---|---|---|---|---|---|---|---|
| | | | As-Baked | 48hrs | 72hrs | 120hrs | 168hrs |
| A | Ceramic 0.4t | Lid's contact to PCB in reflowing | 0/5 | 0/5 | 0/4 | 0/5 | 0/6 |
| | | Gross leak failure | 0/5 | 0/5 | 0/4 | 0/5 | 0/6 |
| | | Solder shape failure after reflow | 0/5 | 0/5 | 0/4 | 0/5 | 0/6 |
| B | BT-resin 0.6t | Lid's contact to PCB in reflowing | 0/4 | 0/3 | 0/3 | 2/4 | 4/5 |
| | | Gross leak failure | 0/4 | 0/3 | 0/3 | 0/4 | 0/5 |
| | | Solder shape failure after reflow | 0/4 | 0/3 | 0/3 | 0/4 | 0/5 |
| C | BT-resin 0.4t | Lid's contact to PCB in reflowing | 0/6 | 1/4 | 2/3 | 1/4 | 3/5 |
| | | Gross leak failure | 0/6 | 0/4 | 1/3 | 2/4 | 4/5 |
| | | Solder shape failure after reflow | 0/6 | 0/4 | 0/3 | 0/4 | 0/5 |
| D | BT-resin 0.6t | Lid's contact to PCB in reflowing | 4/4 | 5/5 | 5/5 | 5/5 | 4/4 |
| | | Gross leak failure | 0/4 | 0/5 | 0/5 | 0/5 | 0/4 |
| | | Solder shape failure after reflow | 0/4 | 1/5 | 5/5 | 5/5 | 4/4 |
| E | BT-resin 0.4t | Lid's contact to PCB in reflowing | 1/3 | 3/5 | 5/5 | 5/5 | 5/5 |
| | | Gross leak failure | 0/3 | 0/5 | 0/5 | 0/5 | 0/5 |
| | | Solder shape failure after reflow | 0/3 | 0/5 | 3/5 | 5/5 | 5/5 |

FIG. 17

PACKAGED SEMICONDUCTOR CHIP

FIELD OF THE INVENTION

This invention relates to a semiconductor device and a method of manufacturing the device and, more particularly, to a semiconductor device with a cavity down type ball grid array (BGA) package and a method of manufacturing the semiconductor device.

DESCRIPTION OF THE RELATED ART

Known BGA packages have mainly employed a package construction called an over molded pad array carrier (OMPAC). A description is given of a known OMPAC construction with reference to FIG. 12. A semiconductor chip 9 is die-bonded on a die pad 166 located on a principal surface (main top surface) of a printed substrate 161. A pad (see 9*a* and 9*b* in FIG. 14) on the semiconductor chip 9 is connected to a wire bond finger 163 on the printed substrate 161 with a metallic wire 1610 made of aluminum. The principal surface of the printed substrate 161 is molded in a resin 16. On the back (main bottom surface) of the printed substrate 161 there are arrayed solder balls as external electrodes 14.

In the OMPAC thus constructed, the resin 16 and the printed substrate 161 are the major structural members, with the result that the resin 16 and the printed substrate 161 substantially constitute a double construction. In addition, such a double construction can cause the printed substrate 161 to warp due to the difference in coefficients of thermal expansion of the resin 16 and the printed substrate 161 and the shrinkage of the thermosetting resin 16 during the manufacturing process. In the case of the BGA, this warpage greatly affects co-planarity. Co-planarity is a factor that greatly contributes to mountability. In the case of an OMPAC, since the co-planarity is as large as approximately 200 $\mu$m when the package body size is 27 mm×27 mm, the co-planarity is large. Hence, enlargement of the package body adversely affects co-planarity, thus causing mounting failure when the package is put into practical use. Co-planarity is a factor (index) indicative of the flatness of the external electrodes 14. When the OMPAC shown in FIG. 12 is mounted on a flat plate, a minimum of three external electrodes 14 come into contact with the mounting substrate 169. Some external electrodes 14 may not contact the flat plate. In this case, the maximum distance (maximum clearance) between the external electrode 14 not contacting the flat plate and the flat plate is called co-planarity. In addition, the printed substrate 161 for the OMPAC commonly has a two-layer construction. The two-layer substrate, as shown in FIG. 12, has a structure in which wiring, a copper foil, is disposed on both surfaces of an insulating substrate. Thus, in the OMPAC, the wiring on both surfaces of the substrate extend to the periphery and are connected one-to-one through through-holes 164. For this reason, the wiring length from the pads 9*a* and 9*b* (FIG. 14) on the semiconductor chip 9 to the external electrodes 14 becomes long, with the result that in the known OMPAC the transmission of an electrical signal tends to be delayed, causing poor electrical performance.

Furthermore, there is a need to pass wires between the external electrodes 14 on the surface where the external electrodes 14 are located, while limiting the number of wires passing between the external electrodes 14 in processing the printed substrate 161. Accordingly, in the known OMPAC, production difficulty is experienced in increasing the number of external electrodes 14 to more than 300 and in reducing the electrode pitch to below 1.5 mm.

Still further, since the OMPAC has the structure shown in FIG. 12, when considering heat radiation, the printed substrate 161 and the resin 16 with a low thermal conductivity act as main paths for heat escaping to the outside and generated due to the electrical operation of the semiconductor chip 9. Accordingly, there is a problem that the known OMPAC has poor thermal performance.

Moreover, since the semiconductor chip 9 and the metallic wires 1610 are molded directly with the resin 16, due to the intrusion of water, the acid contained in the resin 16 sometimes corrodes the aluminum wires 1610.

Furthermore, sometimes a multilayer substrate having wire bond fingers 3 is used to form a two-step structure, as shown in FIGS. 13 and 14, and the wire bond fingers 3 are connected with the pads 9*a* and 9*b* on the semiconductor chip 9 with aluminum wires 10*a* and 10*b*. In general, the aluminum wire is bonded by the wedge bonding method. Wedge bonding is a method in which the bonding is repeatedly made from the wire bond finger 3 side toward the semiconductor chip 9 side (called a reverse bond) and a method where the bonding is, on the contrary, repeatedly made from the semiconductor chip 9 side toward the wire bond finger 3 side (referred to as a forward bond). When bonding to the multilayer substrate with the two-step wire bond finger 3 is carried out only by reverse bonding, as shown in FIG. 13, the wires 10*a* and 10*b* are subject to contact with each other in the vicinity of the pads 9*a* and 9*b* of the semiconductor chip 9. This is because, as shown in FIG. 14, the upper and lower wire bond fingers 3*a* and 3*b* tend to shift transversely during the manufacturing of the multilayer substrate.

As described above, the known OMPAC type BGA semiconductor device has, because of its structure, limitations on each of enlargement of the BGA package, increase in the number of electrodes, decrease in electrode pitch, improvement in electrical performance, improvement in thermal performance, and improvement in mountability.

SUMMARY OF THE INVENTION

The present invention has been developed in order to eliminate the aforesaid problems, and it is, therefore, an object of the present invention to provide a semiconductor device with a BGA package with an increased number of electrodes, a decreased electrode pitch, improved electrical performance, improved thermal performance, and improved mountability, and further to provide a method of manufacturing such a semiconductor device.

In accordance with this invention, a semiconductor device with a BGA (Ball Grid Array) package has a semiconductor chip in a cavity or recess in a central portion of a substrate, a plurality of ball-like external electrodes on the substrate, a lid covering the cavity, and a thermal via on a reverse side of the semiconductor chip.

Preferably, the thermal via includes a copper plated through-hole. More preferably, the inside of the thermal via is filled with a resin.

Furthermore, it is preferable that the upper and lower wire bond fingers be disposed stepwise on the substrate, and the connections between the upper wire bond fingers and the semiconductor chip be made by forward bonding while the connections between the lower wire bond fingers and the semiconductor chip be made by reverse bonding so that the forward and reverse bonds alternate.

Preferably the lid is a ceramic when its area is larger than 300 $mm^2$.

Preferably the surface of an external electrode forming section of the substrate surface includes a plated nickel layer with a thickness larger than 1 μm and an electroplated gold layer with a thickness less than 0.5 μm.

It is desirable that a through-hole corresponding to the external electrode be disposed in the substrate, the inner wall of the through-hole have a roughness with a maximum amplitude less than 20 μm, and a plated copper layer on the inner wall have a thickness greater than 20 μm.

Preferably, the inside of the through-hole disposed in the substrate is filled with a resin or a metal. In addition, at least a metal portion of an end surface of the through-hole in the substrate is preferably covered with a solder resist.

In accordance with a semiconductor manufacturing method according to the invention, pads of the semiconductor chip to be connected with the upper and lower wire bond fingers have a staggered layout, and the method comprises bonding from the lower wire bond fingers toward an outer pad of the semiconductor chip and bonding from inner pads of the semiconductor chip toward the upper wire bond fingers alternatingly.

BRIEF DESCRIPTION OF THE DRAWINGS

The object and features of the present invention will become more readily apparent from the following detailed description of the preferred embodiments taken in conjunction with the accompanying drawings in which:

FIG. 17 is a table showing various packaging arrangements and their measured characteristics.

DESCRIPTION OF THE PREFERRED EMBODIMENTS

Figure 1:
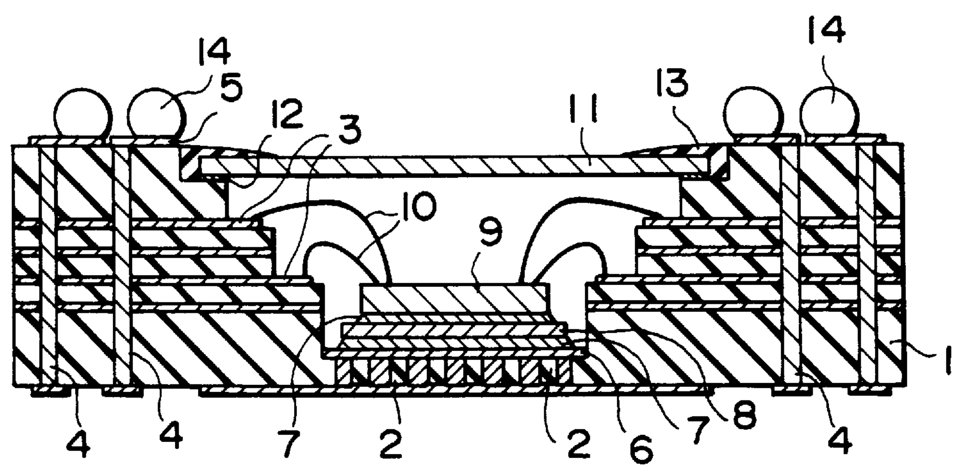
FIG. 1 is a cross-sectional view showing a semiconductor device according to an embodiment of the present invention.

Referring now to FIG. 1, a description is given of an embodiment of this invention. FIG. 1 is a cross-sectional view showing a semiconductor device according to this invention. A multilayer substrate 1 for a package includes a thermal via 2 as a heat radiation means. In FIG. 1, the substrate 1 includes six layers and has a stepped cavity or recessed portion. The internal wiring of the substrate 1 extends from wire bond fingers 3 of the respective layers through through-holes 4 to a land (external electrode formation section) 5. Both a metallic plate 8 and a semiconductor chip 9 are die-bonded to a die pad 6 by means of a die bond resin 7. The metallic plate 8 is made of stainless steel, molybdenum, or the like and relaxes stress while reinforcing the die pad 6. In this embodiment, the metallic plate 8 protects the die pad 6 and the semiconductor chip 9 against being warped due to an increase in internal pressure associated with air expansion in the cavity during reflow mounting. Incidentally, if the size of the semiconductor chip 9 and the volume of the cavity are small, the metallic plate 8 is not always necessary.

In this embodiment, since the metallic plate 8 is interposed, as noted before, as compared with no metallic plate, trouble, such as peeling of the die bonded portion due to thermal stress concentrations, is avoidable. The detection of such troubles is evaluated through environmental tests, such as temperature cycle tests. Thermal stress concentration is caused by the difference in coefficients of thermal expansion of the multilayer substrate 1 and the semiconductor chip 9. Hence, the metallic plate 8 having a coefficient of thermal expansion intermediate the other coefficients of thermal expansion can relax the stress. As the size of the semiconductor chip 9 increases, the effect of the interposition of the metallic plate 8 increases. Thus, long reliability of the package is attainable.

In addition, since the BGA according to this embodiment has a cavity covered by a lid 11, air expansion occurs in the cavity because of the heat applied for reflow mounting. The thickness of the die pad 6 is commonly about 0.5 mm so that the die pad 6 tends to warp due to the air expansion. If the metallic plate 8 is not provided, the semiconductor chip 9 directly adhered to the die pad 6 may crack or peeling may occur. The interposition of the metallic plate 8 can eliminate such problems.

Figure 3:
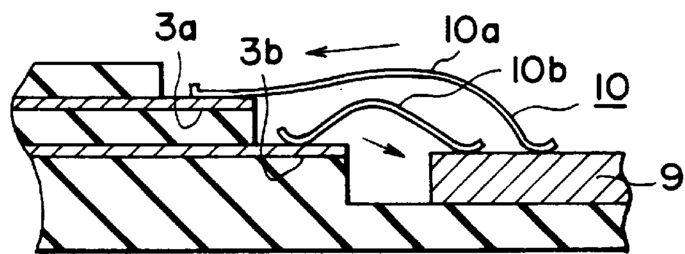
FIG. 3 is an illustration of an embodiment in which an upper wire bond finger 3*a* is forward-bonded while a lower wire bond finger 3*b* is reverse-bonded.
Figure 14:
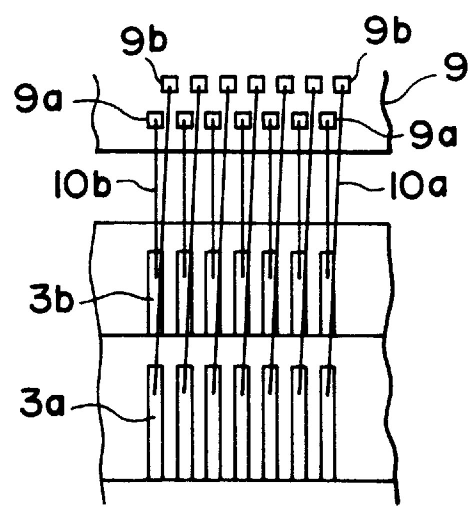
FIG. 14 is a plan view of a privately known example useful for explaining wire contacts occurring when upper and lower wire bond fingers 3*a* and 3*b* are reverse-bonded when they are widely transversely shifted in a package.

In FIG. 1, bonding pads (see 9*a* and 9*b* in FIG. 14) of the semiconductor chip 9 are connected by aluminum wires 10 to the wire bond fingers 3. The bonding pads of the semiconductor chip 9 are arranged in a staggered layout (the pads 9*a* and 9*b* are alternately disposed in two rows at the peripheral portion of the semiconductor chip as shown in FIG. 14), and, hence, the wire bond fingers 3 to be connected to the bonding pads are arranged in a two-step construction (see FIG. 3). In this embodiment, as shown in FIG. 3, after a low finger 3*b* is reverse-bonded to the outer pad 9*a*, the upper finger 3*a* is forward-bonded to the inner pad 9*b*. Since the aluminum wire bond can have a high loop height from a first bonding side, when the lower finger 3*b* is reverse-bonded to the outer pad 9*a* of the semiconductor chip 9 and the upper finger 3*a* is forward-bonded to the inner pad 9*b* of the semiconductor chip 9, sufficient clearance is attainable between the upper and lower loops, with the result that contact between the adjacent wires 10*a* and 10*b* is avoidable. The cavity of the substrate 1 is hermetically sealed with a lid 11. The lid 11 is made from an organic substrate, such as a BT resin, FR4, or a ceramic, and has a thickness of 0.4 to 0.7 mm. After the lid 11 is temporarily set by a B stage semi-hardened thermosetting adhesive sheet 12, a thermosetting potting resin 13 is injected around the lid 11 and cured. The BGA package according to this embodiment is completed after external electrodes 14 are formed on the lands 5. The external electrodes 14 are made of a lead-tin based solder.

Figure 2A:
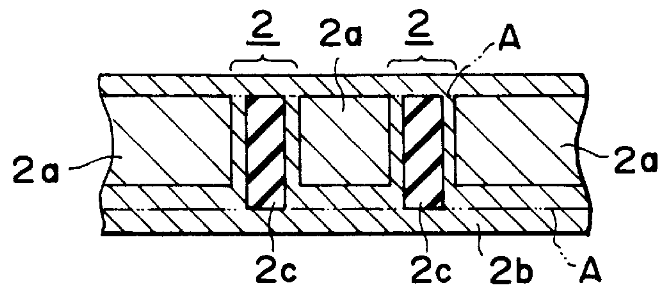
FIG. 2A is a cross-sectional view showing a thermal via of the semiconductor device shown in FIG. 1.
Figure 2B:
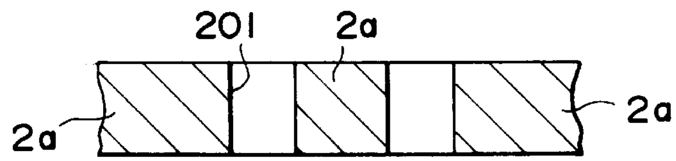
FIGS. 2B–2F are cross-sectional views showing a method of manufacturing the thermal via of FIG. 2A.
Figure 2C:
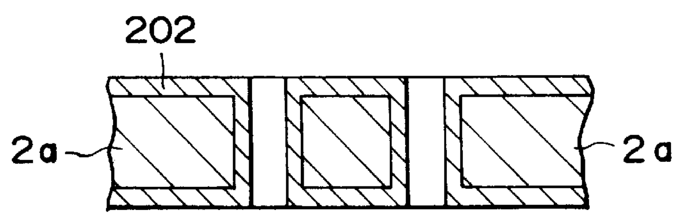
Figure 2D:
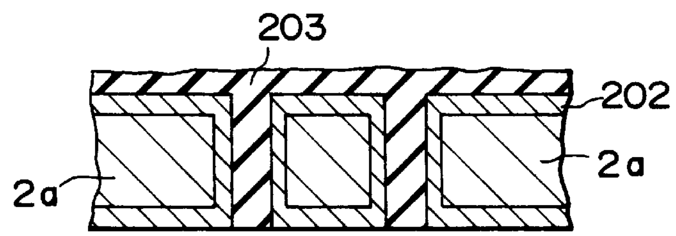
Figure 2E:
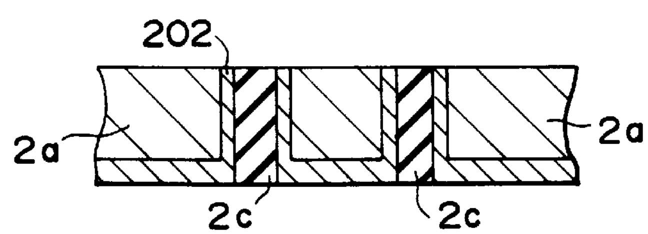
Figure 2F:
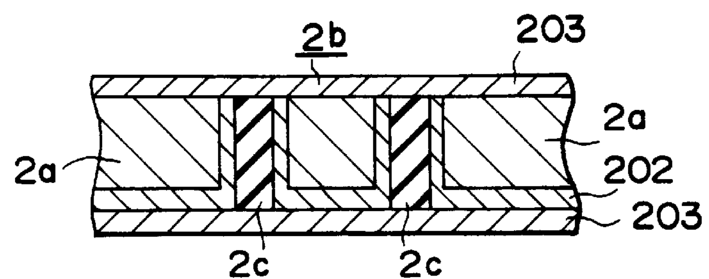

FIG. 2A is a cross-sectional view showing a thermal via 2. In FIG. 2A, numeral 2*a* represents a base material, numeral 2*b* designates a copper foil or a plated copper film, and numeral 2*c* denotes a resin, such as an epoxy resin, filling through-holes in the base material 2*a*. For the formation of the thermal via 2, the through-holes 201 are first made in the base material 2*a*, as shown in FIG. 2B, and a copper foil or plated copper film 202 is then provided on the upper and lower main surfaces of the base material 2*a* and on the inner walls of the through-holes 201 as shown in FIG. 2C. A resin 203 fills the through-holes 201 having the copper foil or plated film 202, as shown in FIG. 2D. The unnecessary resin 203 that overflows from the through-holes 201 and adheres to the upper main surface of the base material 2*a* is removed together with the copper foil or plated copper film 202 on the upper main surface of the base material 2*a*, as shown in FIG. 2E. Thus, the resin 2*c* in FIG. 2A is obtained. Subsequently, as shown in FIG. 2F, a copper foil or plated copper film 203 is formed on the upper main surface of the base material 2*a* and on the lower main surface. Accordingly, the copper foil or plated copper film 2*b* in FIG. 2A comprises the copper foils or plated copper films 202 and 203 as indicated by the two-dot lines in FIG. 2A.

In the thermal via 2, the plated films 2*b* on the through-hole inner walls provide a main transfer path for the escape of heat generated by the semiconductor chip 9. In this embodiment, for example, the thermal via 2 is provided with through-holes that have a diameter of 0.3 mm, a staggered layout at a pitch of 0.9 mm, and a density of 124/cm$^2$ (namely, 124 of the through-holes are disposed per 1 cm$^2$).

Figure 13:
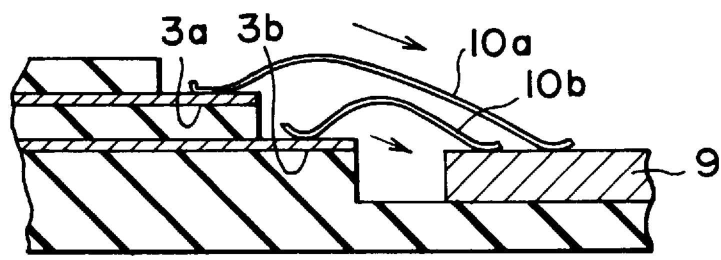
FIG. 13 is a cross-sectional view showing a privately known example in which two-step upper and lower wire bond fingers 3*a* and 3*b* are reverse-bonded in wire bonding.

Secondly, referring to FIGS. 13, 14, and 3, a description is given of wire bonding methods according to a known technique and this embodiment. FIG. 13 is a cross-sectional view showing a related art example in which the upper and lower fingers 3*a* and 3*b* of the wire bond fingers 3 are reverse-bonded. FIG. 14 is a plan view showing a related art example of the wire approaching and contacting when the upper and lower fingers 3 are reverse-bonded in a package that is subject to the transverse wire shifting. When the upper and lower fingers are reverse-bonded, since the upper wire 10*a* approaches the lower wire 10*b*, as shown in FIG. 13, a sufficient clearance cannot be maintained between the upper and lower loops. Hence, there is a possibility of troubles or failures such as contact between the wires. Particularly, if the upper and lower fingers 3*a* and 3*b* are greatly shifted transversely, as shown in FIG. 14, such problems more easily occur.

More specifically, although the upper and lower fingers 3*a* and 3*b* of the wire bond fingers 3 should be arranged alternately, since transverse shifting of the upper and lower fingers 3*a* and 3*b* sometimes arises in manufacturing the multilayer substrate, when the shifting is extreme, the upper and lower fingers 3*a* and 3*b* are arranged on a common straight line, as shown in FIG. 14. In this case, if both the upper and lower fingers 3*a* and 3*b* of the wire bond fingers 3 are reverse-bonded, as shown in FIG. 13, the upper and lower wires 10*a* and 10*b* approach each other, so that a sufficient clearance cannot be maintained between the upper and lower loops, with the result that there is a possibility of contact between the wires.

To eliminate this problem, in this embodiment, the upper fingers 3*a* of the wire bond fingers 3 are forward-bonded while the lower fingers 3*b* are reverse-bonded, as shown in FIG. 3. With this arrangement, as shown in FIG. 3, a sufficient clearance is attainable between the upper and lower loops, improving the wire bond quality. Accordingly, even in a case where the upper and lower fingers 3*a* and 3*b* are transversely shifted from a common straight line, as shown in FIG. 14, a sufficient clearance is attainable between the upper and lower wires 10*a* and 10*b*, preventing interwire contact. Incidentally, if the wire bond fingers 3 have a structure including three or more steps, it is desirable to alternately reverse bond and forward bond.

Figure 15:
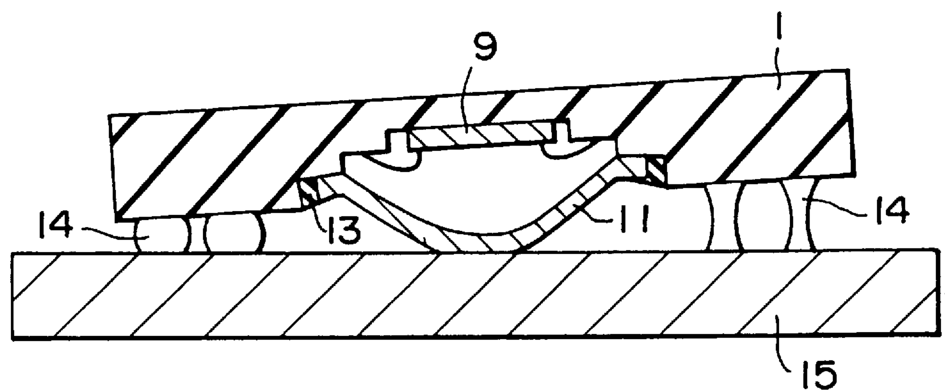
FIG. 15 is a cross-sectional view showing a mounting failure due to lid warpage caused by the heat generated during mounting in a cavity down BGA.

FIG. 15 is a cross-sectional view showing a mounting failure because of lid warpage due to the heat generated during mounting in a cavity down BGA. A rise in the internal pressure within the cavity results from air expansion in the cavity due to the heat applied in the reflow mounting step and the expansion of the moisture in the package. In response to the increase in the internal pressure of the cavity, the lid 11 warps outward, comes into contact with a mounting substrate 15, and lifts the package, causing an abnormality in the joining configuration of the external electrodes 14, as shown in FIG. 15.

FIG. 17 includes a table indicating reflow mounting experiment results for various lid structures. The results are obtained using a package having a lid area of approximately 580 mm$^2$ and a large cavity volume. The lid structures are different in lid material, lid thickness, and depth of the opening in the package substrate. The evaluated items are the presence or absence of the contact of the lid 11 with the mounting substrate 15 in the reflow mounting step, a gross leak test, and the presence or absence of configurational failures of the external electrodes 14 after the reflow mounting. When the lid material is a ceramic, all the evaluation items were satisfied up to the moisture absorption condition of 30° C., 70% relative humidity for 168 hrs. In addition, when the lid area is approximately 200 mm$^2$, so that the cavity volume is small, the experiments indicate that there is no problem even in adopting the C construction or the E construction in FIG. 17.

When the area of the lid 11 is larger than 300 mm$^2$, the lid 11 is a ceramic. Since the semiconductor device is a cavity down BGA, air expansion in the cavity occurs due to heat applied during reflow mounting. When the substrate 1 and the lid 11 are moisture absorbing, expansion corresponding to moisture absorption also takes place. The increase in the internal pressure in the cavity due to air expansion and the moisture vaporization warps the lid 11 toward the outside. In a cavity down package, the lid 11 is placed on the external electrode 14 surface side, so warping of the lid 11 is fatal to proper mounting; that is, the height of the external electrodes 14 is 0.6±0.1 mm for a BGA having, for example, a pitch of 1.27 mm or 1.5 mm, whereas the height of the external electrodes 14 is 400 to 450 μm due to the package weight and other factors during mounting. Hence, the lid warping brings the lid 11 into contact with the mounting substrate 15 so that a mounting failure occurs. This problem is more notable as the cavity volume becomes larger and the area of the lid 11 becomes larger. An organic substrate such as a BT resin or FR4 is advantageous from a cost point of view.

In a package with a large area lid, lid warping becomes larger, so it is preferable that a rigid ceramic be employed as the lid. In more detail, it is desirable that the lid 11 be a ceramic when the area of the lid 11 is larger than 300 $mm^2$. Hermetic sealing of the lid 11 can be achieved when its periphery is sealed with a resin 13. The injection characteristic of the resin 13 improves as the lid 11 becomes thinner, but the lid attachment strength is increased and the lid warpage is reduced as the lid 11 becomes thicker. Considering these facts, it is preferable that the thickness of the lid 11 be 0.4 to 0.7 mm.

Figure 4:
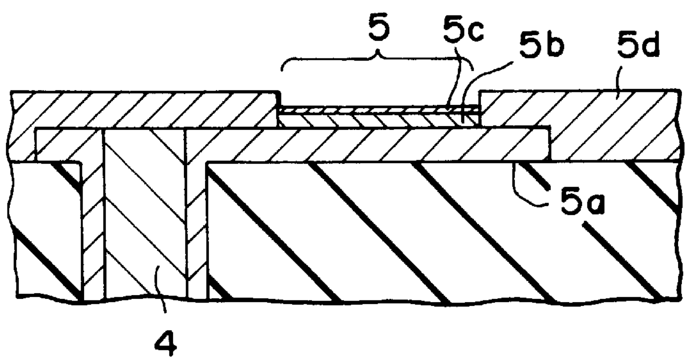
FIG. 4 is a cross-sectional view showing a land before external electrode formation in this embodiment.

FIG. 4 is a cross-sectional view for describing the land 5 before the formation of the external electrodes 14 in this embodiment. In FIG. 4, numeral **5*a* denotes a copper wiring pattern, numeral 5*b* depicts an electroplated nickel film, numeral 5*c* indicates an electroplated gold film, and numeral 5*d* indicates a solder resist. The nickel film 5*b* has a thickness larger than 1 μm and the gold film 5*c* has a thickness less than 0.5 μm. Particularly, when the gold film 5*c* has a thickness less than 0.5 μm, after the formation of the external electrodes 14** of lead-tin solder, the growth of an alloy layer of gold-tin, a fragile intermetallic compound, is suppressed. In addition, when the gold is formed by electroless plating, an abnormality, such as a wetting failure, may arise at the solder joint, irrespective of the thickness of the gold plating. Thus, gold electroplating is more desirable than electroless plating.

The surface of the land 5 on the substrate 1 surface is preferably an electroplated nickel layer with a thickness larger than 1 μm and an electroplated gold layer with a thickness less than 0.5 μm on the electroplated nickel layer for the following reason. Commonly, the surface of the land 5 on the multilayer substrate 1 surface is copper covered with a non-oxidized film, such as solder, nickel-gold, and others. On the other hand, if the wire bond fingers and the land 5 surface are simultaneously processed in manufacturing the package according to this invention, processing is shortened and, hence, the nickel-gold is preferable. For this reason, the land 5 surface on the multilayer substrate surface is the nickel-gold film formed on a patterned copper foil. More specifically, nickel deposited by electroplating has a thickness of more than 1 μm and subsequently gold is electroplated to a thickness of less than 0.5 μm, whereby the growth of an alloy layer of gold-tin, a fragile intermetallic compound, is suppressed after the formation of the external electrodes of a lead-tin solder. Thus, long reliability of the external electrodes 14 is attainable.

Figure 5:
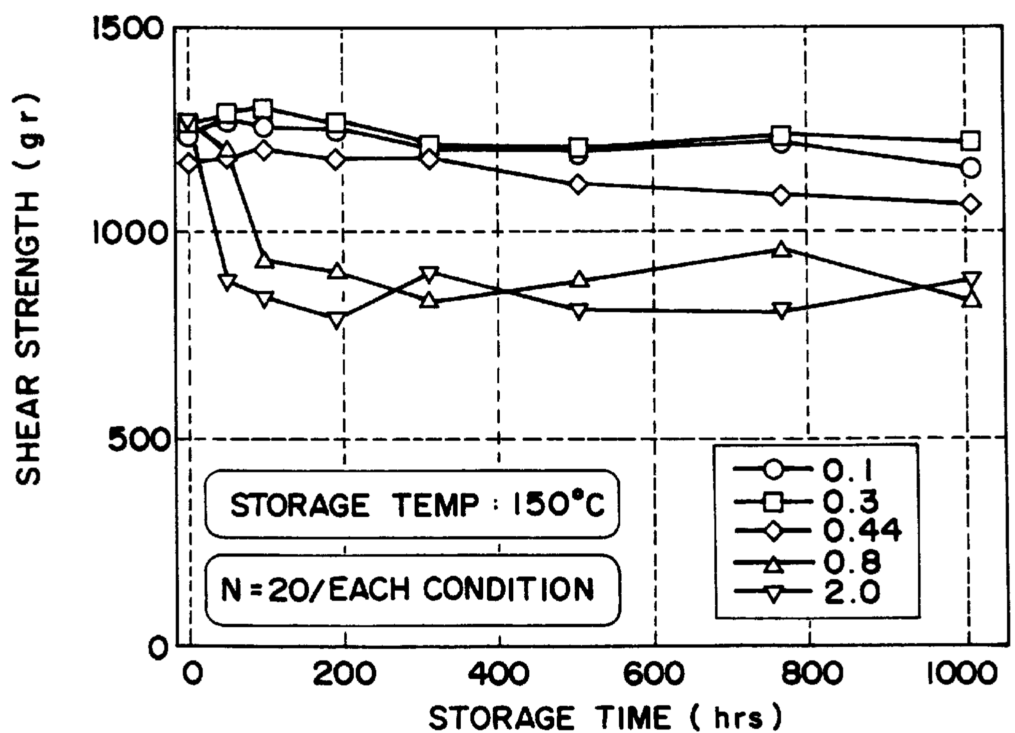
FIG. 5 is a graph of the shear strength variation when an external electrode is stored at a high temperature.

FIG. 5 shows shear strength variation when the external electrodes are kept at a high temperature, where each sample has the land construction shown in FIG. 4 and the nickel film thicknesses are larger than 1 μm and the gold film thicknesses are different from one another. When the plated gold thicknesses are 0.1 μm, 0.3 μm, and 0.44 μm, no strength deterioration occurs because of high-temperature storage. On the other hand, when the thicknesses are 0.8 μm and 2.0 μm, strength deterioration begins at 150° C. after 48 hours. It was found from the observation of broken surfaces that the strength deterioration when the gold is thick came from the growth of an alloy layer of gold-tin. In addition, it has been found that, when the gold is formed by electroless plating, the solder wettability is poor and stable strength is not attained. Accordingly, as the plating method, electroplating is employed in order to improve solder wettability and the gold film thickness is limited to less than 0.5 μm. Here, the solder wettability signifies that the solder uniformly, smoothly, and continuously spreads on a metal surface.

Figure 6:
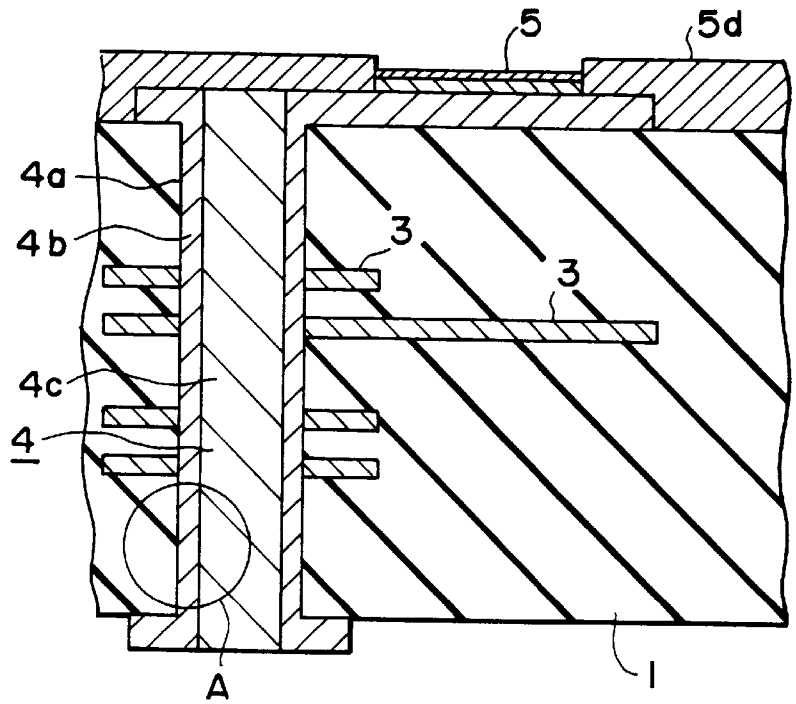
FIG. 6 is a cross-sectional view showing through-holes 4 contiguously present in one-to-one relation to a plurality of external electrodes.
Figure 7:
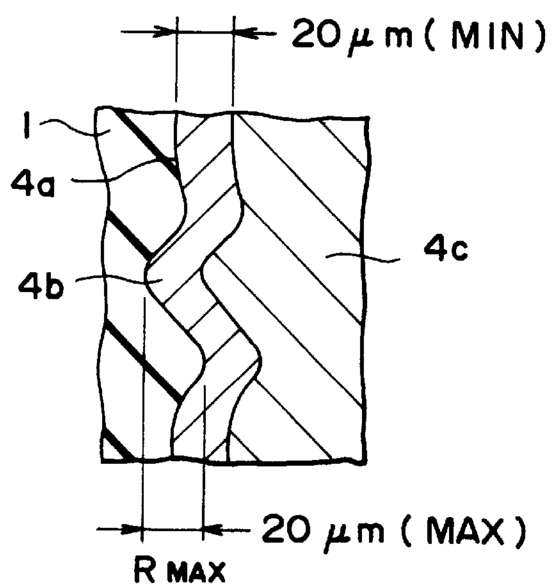
FIG. 7 is an enlarged view showing an inner wall of the through-hole portion indicated by character A in FIG. 6.

FIG. 6 is a cross-sectional view showing a through-hole adjacent an external electrode 14 (see FIG. 1). In FIG. 6, numeral **4*a* represents an inner wall surface of the substrate itself after being drilled, numeral 4*b* designates a plated copper through-hole film, numeral 4*c* denotes a resin filling the through-hole or a flat metal plug, and numeral 5 indicates a land (external electrode formation section). Further, FIG. 7 is an enlarged view of an inner wall portion of the through-hole indicated by character A in FIG. 6. In this embodiment, as shown in FIG. 7, the roughness of the inner wall surface 4*a* of the substrate 1 itself has a maximum surface variation, i.e., amplitude, (Rmax) less than 20 μm. This smoothness is realized by optimizing the hole drilling conditions. Moreover, the plated through-hole film 4*b* is thicker than 20 μm, improving the coverage of the plated through-hole film 4*b* and making the plated through-hole film 4*b*** durable against heat shock during mounting of the BGA package and heat cycling during use after mounting.

Figure 8:
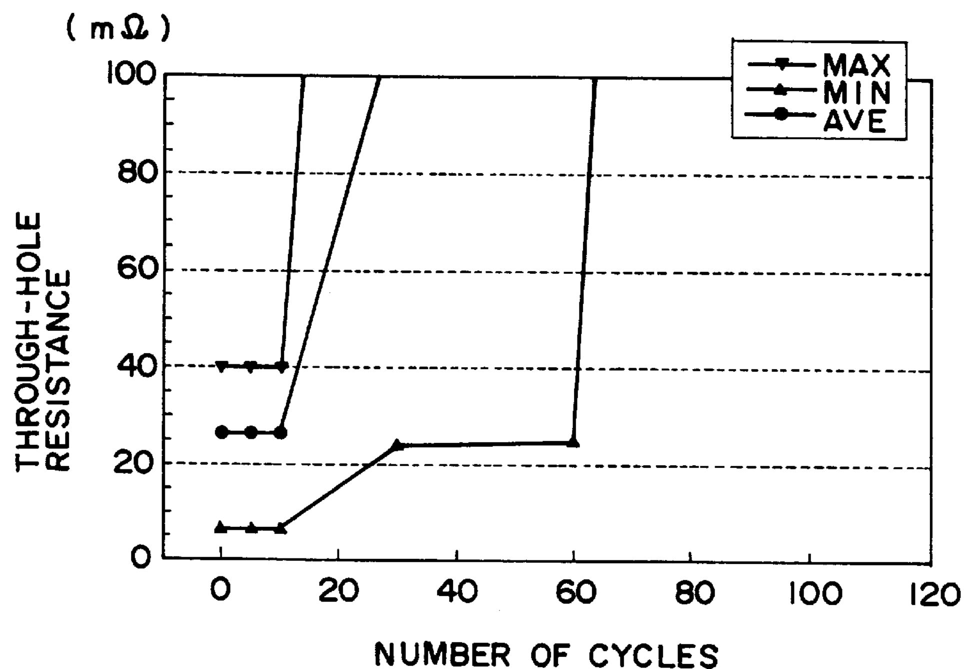
FIG. 8 is a graph of variation of through-hole resistance measured by the oil dip method with a through-hole inner wall roughness having a maximum amplitude (Rmax) exceeding 20 μm and a plated copper 10 layer μm thick.
Figure 9:
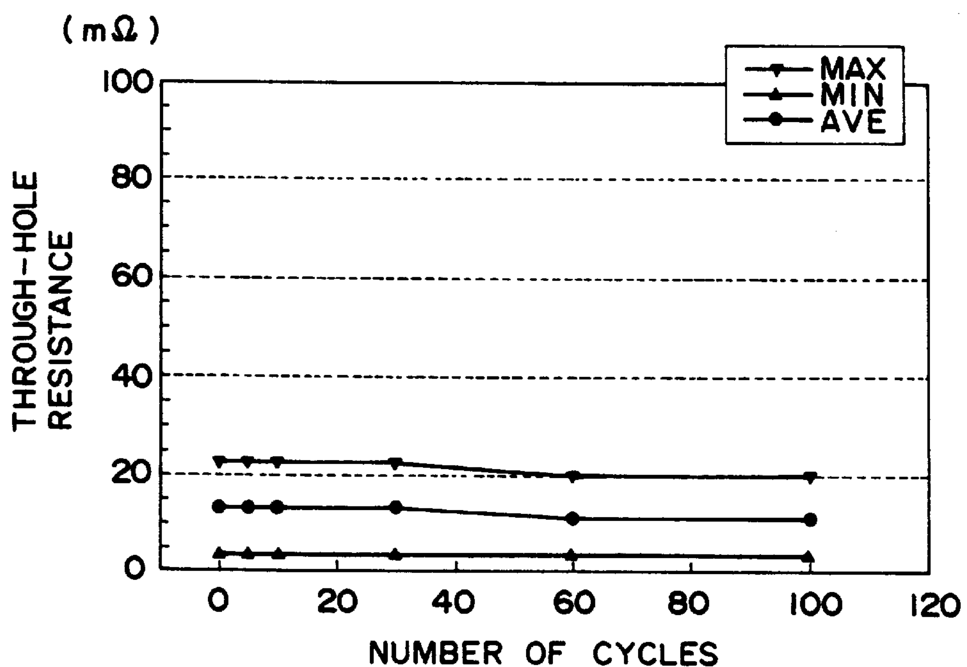
FIG. 9 is a graph of variation of through-hole resistance measured by the oil dip method with a through-hole inner wall roughness having an amplitude (Rmax) less than 20 μm, a plated copper layer 20 μm thick, and a flat plug.

FIGS. 8 and 9 are graphs of the variation of the through-hole (continuity) resistance obtained in an oil dip test. Explaining in detail, FIG. 8 shows a result when the surface roughness of the through-hole inner wall **4*a* has a maximum amplitude (Rmax) larger than 20 μm and the thickness (plated copper thickness) of the through-hole plating film 4*b* is 10 μm. Further, FIG. 9 shows a result when the surface roughness of the through-hole inner wall 4*a* is less than 20 μm, the plated copper thickness is larger than 20 μm, and the flat plug 4*c* is used. In the oil dip test, one cycle is from 260° C. for 10 seconds to 20° C. for 20 seconds. With the FIG. 8 structure, the through-hole (continuity) resistance increased beginning at the 30th cycle, whereas with the FIG. 9 structure, the through-hole (continuity) resistance was stable up to the 100th cycle. Accordingly, in this embodiment the through-hole structure is determined such that the surface roughness of the inner wall 4*a*** has a maximum amplitude (Rmax) less than 20 μm and the plated copper has a thickness larger than 20 μm.

Figure 10:
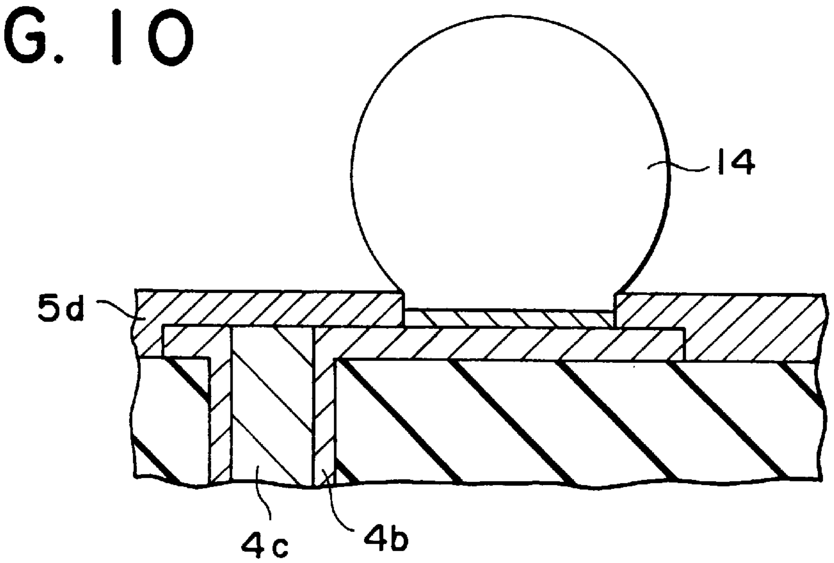
FIG. 10 is a cross-sectional view showing an example according to this embodiment in which an external electrode through-hole end surface is totally covered with a photosensitive solder resist in order to eliminate the problems described with reference to FIG. 16.
Figure 16:
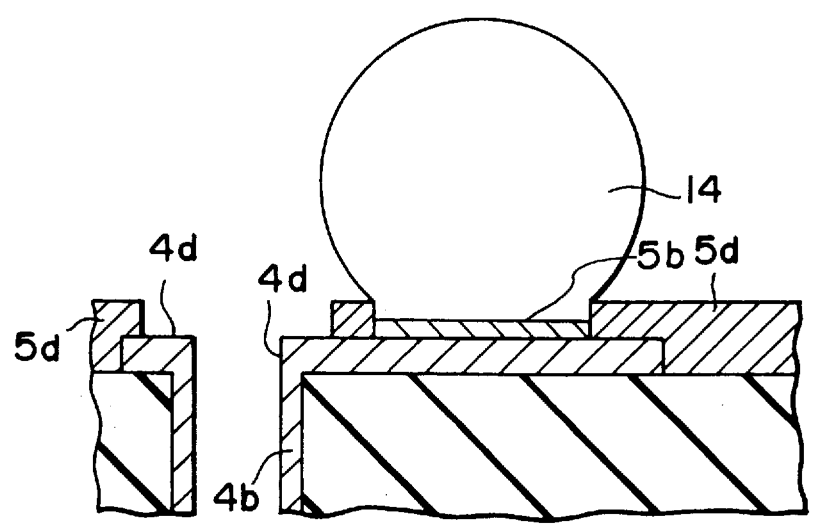
FIG. 16 is a cross-sectional view useful for describing a privately known example where a metallic portion of an external electrode through-hole end surface is exposed.

FIG. 16 is a cross-sectional view showing a related art example where a metal portion is exposed at an external electrode 14 side adjacent a through-hole end surface, and FIG. 10 is a cross-sectional view showing an example according to this embodiment where an external electrode 14 is adjacent a through-hole end surface that is totally covered with a photosensitive solder resist in order to eliminate the related art problem. In FIG. 16, numeral **4*b* represents a through-hole plating film, numeral 4*d* depicts a through-hole end surface with an exposed metal portion, numeral 5*d* indicates a solder resist, and numeral 14 indicates an external electrode. The solder resist 5*d* is a liquid photosensitive solder resist or a photosensitive dry film. In order to recognize the BGA, automatic mounting apparatus generally recognizes the BGA from light reflected from the external electrode 14. In this recognition, when the BGA has the FIG. 16 structure, an error in recognition can take place because both the exposed through-hole end surface 4*d* and the external electrode 14 reflect light. On the other hand, in the BGA structure shown in FIG. 10, the inside of the through-hole is filled with a resin or the metal flat plug 4c and the through-hole end surface 4d is covered with the solder resist 5d. With this structure, the metal portion is not exposed at the through-hole end surface 4d, unlike the example of FIG. 16. Hence, in BGA recognition by an automatic mounting apparatus, the error in recognition, described with reference to FIG. 16 does not occur because only recognition of the external electrode 14** is possible.

Figure 11:
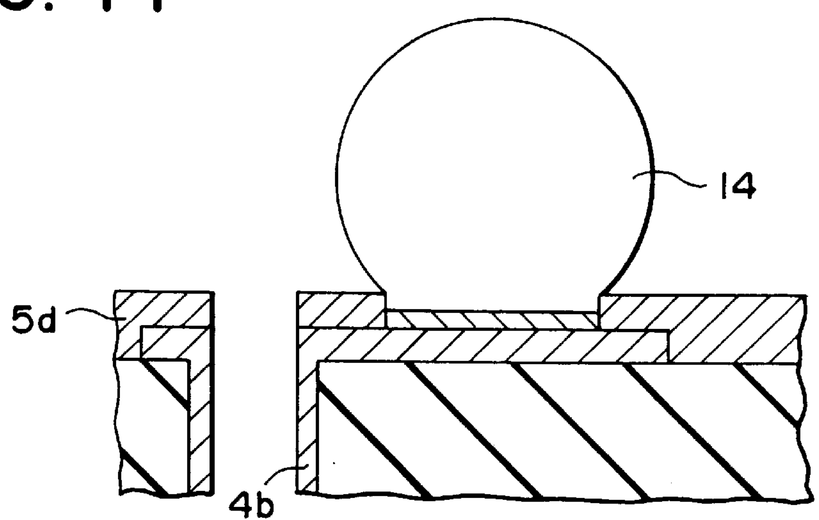
FIG. 11 is a cross-sectional view showing an example according to another embodiment in which an external electrode through-hole end surface has an opening equal in dimension to a through-hole in a photosensitive solder resist in order to eliminate the problems described with reference to FIG. 16.
Figure 12:
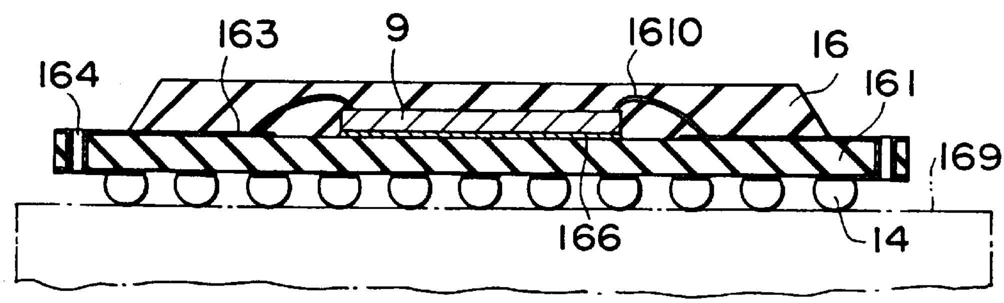
FIG. 12 is a view of a privately known BGA package construction called an OMPAC (Over Molded Pad Array Carrier).

FIG. 11 is a cross-sectional view showing an example according to another embodiment where an external electrode 14 adjacent a through-hole end surface has an opening equal in size to the through-hole in order to eliminate the related art problem. Although in the FIG. 11 structure the through-hole is not filled with a packing material or the flat plug 4c, the metal portion of the through-hole end surface 4d is covered with the solder resist 5d. As a result, like the FIG. 10 embodiment, the error in recognition, described in conjunction with FIG. 16, does not occur in the recognition of the BGA by automatic mounting apparatus since only the external electrode 14 is reliably recognizable.

Since the metal portion of the through-hole end surface on the substrate is covered with the solder resist, and, more specifically, the external electrode through-hole end surface is totally covered by the photosensitive solder resist 5d or has an opening equal in size to the through-hole, mounting by automatic mounting apparatus becomes easy. This structure is effective, particularly in the case of a BGA where through-holes are placed in adjacent, one-to-one relation to the plurality of external electrodes 14. BGA recognition by the automatic mounting apparatus relies on all of the external electrodes 14 being solder balls, but there is a possibility that the automatic mounting apparatus may mistake the through-hole end surface as a solder ball when the metal portion of the through-hole end surface is exposed. Such an error in recognition is prevented by covering the metal portion of the through-hole end surface with the solder resist 5d.

As has been described above, there is provided a structure in which the semiconductor chip 9, the wires 10, and other parts are not molded with a molding resin, whereby it is possible to prevent the substrate from warping due to the difference in coefficients of thermal expansion of the molding resin and the substrate, and the thermosetting shrinkage of the mold resin, and, hence, to enhance mountability.

In addition, since through-holes are located in adjacent one-to-one relation to a plurality of external electrodes, the wiring length from the pad on the semiconductor chip to external electrodes can be shortened so that the transfer of electrical signals is fast, improving electrical performance.

Since, as shown in FIG. 3, the lower finger 3b of the wire bond fingers 3 is reverse-bonded to the outer pad 9a of the semiconductor chip 9 while the upper finger 3a is forward-bonded to the inner pad 9b of the semiconductor chip 9, sufficient clearance is obtained between the upper and lower loops of the wires to prevent contact between adjacent wires 10a and 10b. Both forward bonding and reverse bonding are carried out, so that narrow-pitch bonding to the multilayer substrate 1 with the two-step wire bond fingers 3 is possible, increasing the number of the electrodes and decreasing electrode pitch.

In addition, since the thermal via 2, a heat radiation means, is located at the reverse side of the semiconductor chip 9, the heat generated by the semiconductor chip 9 can effectively escape from the semiconductor chip 9 through the thermal via 2 and thermal performance sharply improves.

Still further, as shown in FIG. 2, the thermal via 2 includes a through-hole covered with a plated copper film 2b that has a high thermal conductivity, and, hence, the thermal radiation characteristic is further improved.

The thermal via 2 is filled with the resin 2c, such as an epoxy resin, and, as compared with no packing (because air has poor thermal conductivity), the thermal radiation characteristic is further improved.

Since a cavity down BGA package is realized with the semiconductor chip 9 encased within the cavity of the multilayer substrate 1 and the cavity is covered by the lid 11, related art problems, such as corrosion of aluminum wires arising when the semiconductor chip is encapsulated in a resin, are avoided.

When the area of the lid 11 is larger than 300 $mm^2$, the lid 11 is a ceramic with the result that warping of the lid 11 in response to a rise in the internal cavity pressure due to heat applied during the reflow mounting is suppressed and mounting failures due to warping of the lid 11 are avoided.

The land 5 is the external electrode 14 formation section of the substrate 1 and is composed of an electroplated nickel film 5b with a thickness larger than 1 $\mu$m and an electroplated gold film 5c with a thickness smaller than 0.5 $\mu$m. Thus, after the formation of the external electrodes 14 of a lead-tin solder, growth of an alloy layer of gold-tin, a fragile intermetallic compound, is suppressed. Therefore, long reliability of the external electrodes 14 is attainable and wettability of the solder improves.

The surface roughness of the inner wall 4a of the through-hole 4 has a maximum amplitude (Rmax) less than 20 $\mu$m and the thickness of the plated copper film 4b on the surface of the through-hole 4 is larger than 20 $\mu$m. As a result, the through-hole 4 stability during heat cycling improves. The plated copper film 4b on the through-hole 4 can withstand heat shock during mounting of the BGA package and heat cycling in use after mounting so that reliability of the through-hole 4 is improved.

As shown in FIG. 6, the inside of the through-hole 4 is filled with a flat plug 4c of a resin or a metal, further improving the resistance to heat shock during mounting of the BGA package and heat cycling in use after mounting.

The metal portion of the end surface 4d of the through-hole 4 in the substrate 1 is covered with the solder resist 5d, which prevents an automatic mounting apparatus from mistaking the external electrode 14 for a solder ball during mounting.

In a method of manufacturing the semiconductor device according to this invention, the pads 9a and 9b of the semiconductor chip 9 are connected to the stepped upper and lower fingers 3a and 3b in a staggered arrangement. Wire bonds are alternately made from the lower finger 3b toward the outer pad 9a of the semiconductor chip 9 (reverse bond), and from the inner pad 9b of the semiconductor chip 9 toward the upper finger 3a (forward bond). Thus, a sufficient clearance is attained between the upper and lower wire loops to avoid contact between adjacent wires 10a and 10b, with the result that narrow-pitch bonding to the multilayer substrate 1 having the two-step wire bond fingers 3 is achieved.

It should be understood that the foregoing relates only to preferred embodiments of the present invention and that it is intended to cover all changes and modifications of the embodiments of the invention that do not constitute departures from the spirit and scope of the invention.

What is claimed is:

1. A semiconductor device comprising:

a laminated substrate including a plurality of laminated glass-epoxy layers, a stepped recess having a bottom, and a plurality of through-holes filled with an electrically conductive material and extending through the laminated layers;

a semiconductor chip disposed on the bottom of the recess;

a plurality of external electrodes comprising a respective solder ball corresponding to each of the through-holes and disposed on said laminated substrate beside, but not directly opposite the respective through-hole;

a lid bonded to said laminated substrate, covering the recess, and defining, with the recess, an internal volume; and radiating means disposed between said semiconductor chip and said laminated substrate for transmitting heat from said semiconductor chip to said laminated substrate for radiation, said radiating means comprising a thermal via including a through-hole in said laminated substrate, a metal film on an inner wall of, but not filling, the through-hole and in contact with the metal film.

2. A semiconductor device comprising:

a substrate having a recess;

a semiconductor chip disposed in the recess;

a plurality of external electrodes disposed on said substrate;

a lid covering the recess; and a land located on said substrate and electrically connected to one of said external electrodes, wherein said land includes a nickel layer disposed on said substrate and having a thickness larger than 1 $\mu$m and a gold layer disposed on said nickel layer and having a thickness less than 0.5 $\mu$m.

3. A semiconductor device comprising:

a substrate having a recess;

a semiconductor chip disposed in the recess;

a plurality of external electrodes disposed on said substrate;

a lid covering the recess; and through-holes extending through said substrate, a metal layer on inner walls of the through-holes, each metal layer of each through-hole being electrically connected to a corresponding external electrode, and a plurality of lands disposed on said substrate wherein said inner walls have variations in surface finish not exceeding 20 $\mu$m in amplitude, and said metal layers on said inner walls have a thickness larger than 20 $\mu$m.

4. The semiconductor device as claimed in claim 3 comprising a resin filling the through-holes and in contact with said metal layers.

5. The semiconductor device as claimed in claim 3 comprising a metal filler filling the through-holes in contact with said metal layers.

6. A semiconductor device comprising:

a substrate having a recess;

a semiconductor chip disposed in the recess;

a plurality of external electrodes disposed on said substrate;

a lid covering the recess;

through-holes extending through said substrate; and a solder resist covering at least an end surface of said metal layer on said inner walls of the through-holes, the end surface being exposed at a surface of said substrate.

7. The semiconductor device of claim 1 wherein the lid is an organic material and including a B stage sheet and a thermosetting resin bonding the lid to the laminated substrate.

* * * * *